US012592675B2

(12) United States Patent
Edgar et al.

(10) Patent No.: US 12,592,675 B2
(45) Date of Patent: Mar. 31, 2026

(54) AUDIO DEVICE WITH MICROPHONE AND MEDIA MIXING

(71) Applicant: GN Audio A/S, Ballerup (DK)

(72) Inventors: Christian Edgar, London (GB); Sohejl Zabetian, Berlin (DE)

( * ) Notice: Subject to any disclaimer, the term of this patent is extended or adjusted under 35 U.S.C. 154(b) by 202 days.

(21) Appl. No.: 18/389,832

(22) Filed: Dec. 20, 2023

(65) Prior Publication Data

US 2024/0235509 A1 Jul. 11, 2024

(30) Foreign Application Priority Data

Jan. 6, 2023 (EP) .................................... 23150610

(51) Int. Cl.

*H03G 3/32* (2006.01)
*G10L 21/0216* (2013.01)
*G10L 25/84* (2013.01)

(52) U.S. Cl.

CPC ........... *H03G 3/32* (2013.01); *G10L 21/0216* (2013.01); *G10L 25/84* (2013.01); *G10L 2021/02168* (2013.01)

(58) Field of Classification Search

CPC .......... H03G 3/32; H03G 3/3005; H04R 3/00; H04R 2430/00; G10L 21/0216; G10L 25/84; G10L 2021/02168; G06F 3/165; G10K 11/17823; G10K 11/17827; G10K 11/17837; G10K 11/17885; G10K 11/17873; G10K 2210/1081; G10K 2210/3056

See application file for complete search history.

(56) References Cited

U.S. PATENT DOCUMENTS

2014/0126736 A1* 5/2014 Gauger, Jr. ...... G10K 11/17837 381/71.6
2019/0130928 A1* 5/2019 Rule ................ G10K 11/17837
2022/0189451 A1* 6/2022 Rui .................... G10K 11/1783

FOREIGN PATENT DOCUMENTS

WO 2022132721 6/2022

* cited by examiner

*Primary Examiner* — Yogeshkumar Patel

(57) ABSTRACT

An audio device comprising an interface, a memory, and one or more processors is disclosed, wherein the one or more processors are configured to: obtain a microphone input signal; obtain a media input signal; process the microphone input signal for provision of a microphone output signal; and provide an audio output signal based on the microphone output signal, wherein to process the microphone input signal comprises to: determine a microphone gain; and apply the microphone gain to the microphone input signal for provision of the microphone output signal, and wherein to determine the microphone gain comprises: estimate a first loudness of the microphone input signal; determine a first primary average based on the first loudness; estimate a second loudness of the media input signal; determine a second average based on the second loudness; determine a first gain based on the first primary average and the second average; determine a first secondary average based on the first loudness; determine a second gain based on the first secondary average and the second average; and determine the microphone gain based on the first gain and the second gain.

15 Claims, 4 Drawing Sheets

AUDIO DEVICE WITH MICROPHONE AND MEDIA MIXING

RELATED APPLICATIONS

This application is a non-provisional application that claims the priority benefit of European Patent Application No. EP 23150610.6 filed on Jan. 6, 2023, the entire contents of which are incorporated herein by reference.

FIELD

The present disclosure relates generally to an audio device, in particular audio devices for improving audio quality and intelligibility, e.g. during hearthrough processing.

BACKGROUND

Often, a user of an audio device experiences situations in which the user would want to listen to media on the user's audio device whilst also hearing the surroundings or outside world, i.e. listen to media and hearthrough. However, it is often not possible to consistently listen to both of these signals without one dominating the other. For example, in situations with low hearthrough levels the user is forced to considerably reduce the media volume, meaning a less than optimal experience for many users.

SUMMARY

Accordingly, there is a need for audio devices which can improve audio quality and intelligibility during media playback and hearthrough.

Also, there is a need for audio devices which may mitigate, alleviate, or address the existing shortcomings, for example by improving audio quality and/or intelligibility of combined media playback and hearthrough in an audio device.

Disclosed herein are examples of an audio device. The audio device comprises an interface, memory, and one or more processors, wherein the one or more processors are configured to obtain a microphone input signal; obtain a media input signal; process the microphone input signal for provision of a microphone output signal; and provide an audio output signal based on the microphone output signal. To process the microphone input signal comprises to determine a microphone gain and apply the microphone gain to the microphone input signal for provision of the microphone output signal. To determine the microphone gain comprises to estimate a first loudness of the microphone input signal; optionally determine a first primary average based on the first loudness; estimate a second loudness of the media input signal; determine a second average based on the second loudness; and optionally determine a first gain based on the first primary average and/or the second average. To determine the microphone gain comprises to optionally determine a first secondary average based on the first loudness; and determine a second gain based on the first secondary average and the second average. To determine the microphone gain comprises to determine the microphone gain based on the first gain and/or the second gain.

Also a method for operating an audio device is disclosed, the audio device comprising an interface, memory, and one or more processors, wherein the method comprises obtaining a microphone input signal; obtaining a media input signal; processing the microphone input signal for provision of a microphone output signal; and providing an audio output signal based on the microphone output signal, wherein processing the microphone input signal comprises determining a microphone gain; and applying the microphone gain to the microphone input signal for provision of the audio output signal. In the method, determining the microphone gain comprises estimating a first loudness of the microphone input signal; optionally determining a first primary average based on the first loudness; estimating a second loudness of the media input signal; determining a second average based on the second loudness; and optionally determining a first gain based on the first primary average and/or the second average. In the method, determining the microphone gain comprises optionally determining a first secondary average based on the first loudness; and determining a second gain based on the first secondary average and/or the second average. Determining the microphone gain comprises determining the microphone gain based on the first gain and/or the second gain.

It is an advantage of the present disclosure that the audio device can be configured to enhance or improve situational awareness while listening to media in audio devices.

Further, the present disclosure provides an audio device providing improved audio quality and intelligibility of audio signals.

Advantageously, a user can rely on the disclosed audio device to be able to clearly distinguish both hearthrough and media. Further, a user can increase the volume of their media without worry of no longer hearing their environment. Also, a user does not have to manually alter the level of hearthrough and the need or desire to only use one ear-bud in 'awareness' situations is reduced or removed. Subjective user testing of the disclosed audio device has demonstrated significant user appeal for the feature. Offline tests have shown strong preference amongst users for the disclosed mixing scheme when compared to manual hearthrough, especially in environments where increased awareness is prioritized.

BRIEF DESCRIPTION OF THE DRAWINGS

The above and other features and advantages of the present disclosure will become readily apparent to those skilled in the art by the following detailed description of exemplary embodiments thereof with reference to the attached drawings, in which.

DETAILED DESCRIPTION

Figure 1:
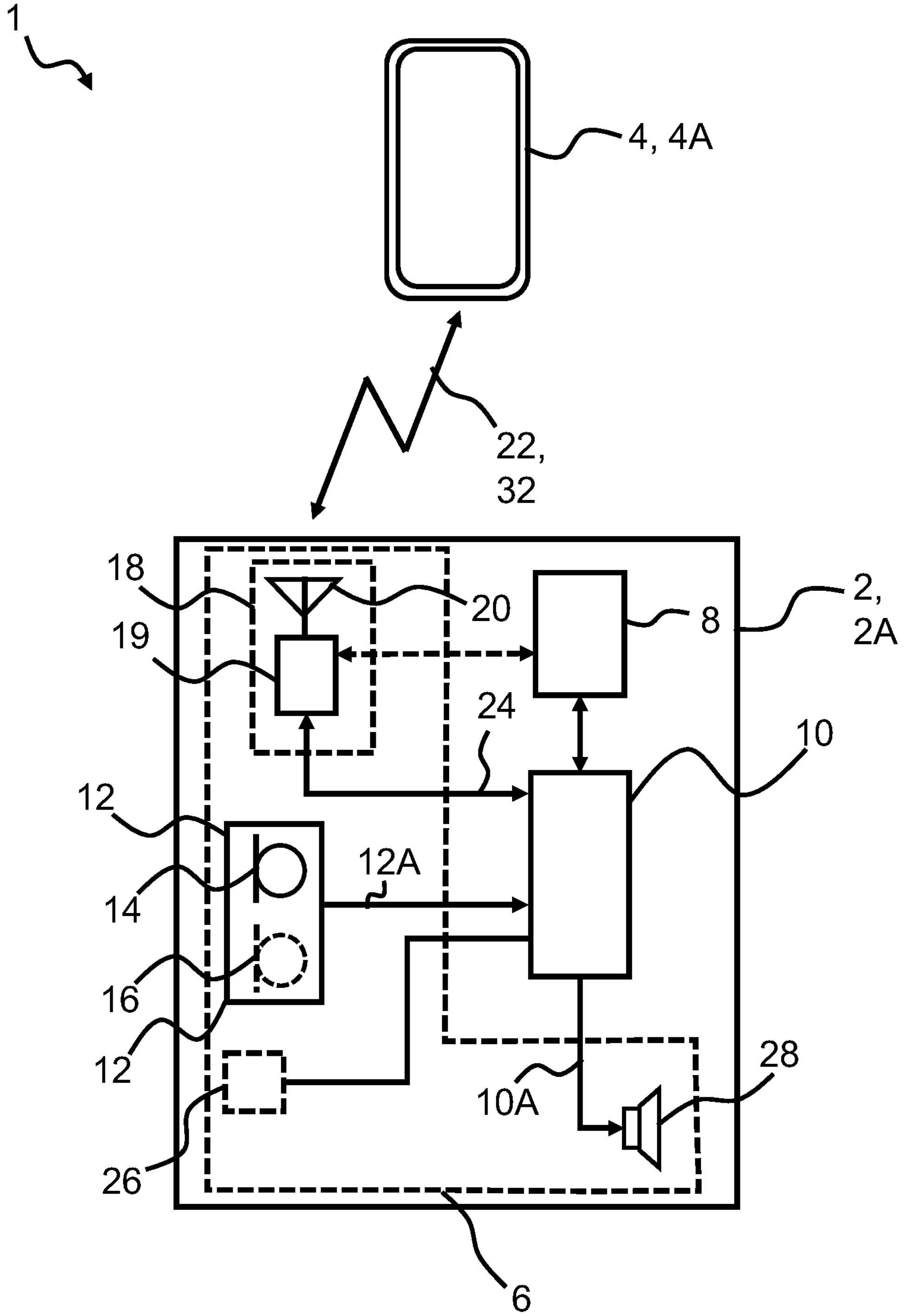
FIG. 1 illustrates an example audio system.

Various exemplary embodiments and details are described hereinafter, with reference to the figures when relevant. It should be noted that the figures may or may not be drawn to scale and that elements of similar structures or functions are represented by like reference numerals throughout the figures. It should also be noted that the figures are only intended to facilitate the description of the embodiments. They are not intended as an exhaustive description of the invention or as a limitation on the scope of the invention. In addition, an illustrated embodiment needs not have all the aspects or advantages shown. An aspect or an advantage described in conjunction with a particular embodiment is not necessarily limited to that embodiment and can be practiced in any other embodiments even if not so illustrated, or if not so explicitly described.

Disclosed herein are examples of audio devices. Audio devices may be one or more of: headsets, audio signal processors, headphones, computers, mobile phones, tablets, servers, microphones, speakers, software, and applications. The audio device may be a single audio device. The audio device may be a plurality of interconnected audio devices, such as a system. The audio device may be configured to process audio. The audio device can be configured to output audio. The audio device can be configured to obtain, such as receive, audio.

The audio device comprises an interface, memory, and one or more processors.

In one or more example audio devices, the audio device, such as the one or more processors, can include or implement one or more modules. The modules can, for example, include a number of components such as electronics, mechanics, etc. in order to perform one or more particular actions or operations. The modules may be physical modules. The modules may be electronic modules. The modules may be computational modules and/or software modules.

In one or more example audio devices, the audio device can include one or more memories. A memory can be configured to store one or more of criteria, signals, schemes, parameters, coefficients, gains, averages, etc. The memory may be utilized by one or more processors of the audio device discussed herein. One or more processors discussed herein can utilize the memory for storage and/or retrieving of data.

In one or more example audio devices, the audio device, such as the one or more processors/controller can include one or more adders for adding or multiplying one or more parameters, such as gains. Thus, an adder may be seen as a multiplier.

In one or more example audio devices, the one or more processors can be configured to process the microphone input signal. The one or more processors can be configured to process the media input signal. For example, the one or more processors can process by one or more of: filtering, applying gain, transforming, beamforming, noise suppressing, attenuating, speech enhancement, hearing loss compensation, amplitude compression, and adjusting gain.

The audio device may include an input module. The input module may include a first microphone and optionally a second microphone. The input module can be configured to apply certain processing to audio received by the first microphone and the second microphone. For example, the input module may be configured to transform microphone signals from analog-to-digital and/or from time-domain to frequency domain. The input module can be configured to apply a fast Fourier transformation. The input module may include one or more AD converters and one or more filters, such as one or more filter banks and/or one or more transient noise suppressors. In one or more example audio devices, the input module may be configured to output the microphone input signal, e.g. to a mixer and/or a controller of the one or more processors.

In one or more examples, the one or more processors are configured to obtain, such as receive and/or determine, a microphone input signal also denoted IS_MIC; obtain, such as receive and/or determine, a media input signal also denoted IS_MED; process the microphone input signal for provision of a microphone output signal also denoted OS_MIC; and provide an audio output signal also denoted AOS based on the microphone output signal, wherein to process the microphone input signal comprises to determine, e.g. using a microphone gain determiner, a microphone gain also denoted G_MIC; and apply the microphone gain G_MIC to the microphone input signal IS_MIC for provision of the microphone output signal.

The microphone gain can be a gain vector. The microphone gain can be a gain vector with K frequency band gains.

Thus, the audio output signal may be based on the microphone input signal and/or the media input signal, such as a linear combination of the microphone input signal and the media input signal. In one or more examples, the audio output signal AOS is given by:

$$AOS = G\_MIC * IS\_MIC + G\_MED * IS\_MED,$$

where G_MIC is a microphone gain applied to the microphone input signal IS_MIC for provision of a microphone output signal, and G_MED is a media gain applied to the media input signal IS_MED for provision of a media output signal. It is noted that AO, G_MIC, IS_MIC, G_MED, IS_MED may be vectors with K values for processing input signals in K bands or channels in the audio device.

In one or more examples, the audio output signal AOS is given by:

$$AOS = G\_MIC * IS\_MIC + IS\_MED,$$

where G_MIC is a microphone gain applied to the microphone input signal IS_MIC for provision of a microphone output signal, and IS_MED is the media input signal.

The microphone input signal may be a single-band signal or a multi-band signal with K frequency bands/bins, e.g. where K is larger than 10 or even larger than 20. K may be larger than 30. The audio device may comprise a filterbank for provision of the microphone input signal, e.g. based on an output of a microphone. In one or more example audio devices, the audio device comprises or is connected, e.g. by wire or wirelessly, to a microphone for provision of the microphone input signal, e.g. via a filterbank.

In one or more example audio devices, the interface comprises a wireless transceiver also denoted radio transceiver and an antenna for wireless reception of input signal(s), such as the media input signal, and/or wireless transmission of output signal(s), such as the audio output signal. The audio device may be configured for wireless communication with one or more devices, such as with another audio device and/or with one or more accessory devices, such as one or more of a smartphone, a tablet computer and/or a smart watch. The wireless input signal(s), such as the media input signal in a wireless implementation, may origin from one or more accessory devices, such as one or more of a smartphone, a tablet computer and/or a smart watch.

In one or more example audio devices, the interface comprises a connector for wired input of the media input signal and/or wired output of the audio output signal via the connector.

In one or more example audio devices, the audio device comprises or is connected, e.g. by wire or wirelessly, to a loudspeaker also denoted receiver for output or playback of audio based on the audio output signal.

In one or more examples, to determine the microphone gain comprises to estimate e.g. using a first loudness estimator, a first loudness also denoted L_1 of the microphone input signal; and determine one or more averages, such as a first primary average also denoted A_1_1, based on the first loudness L_1.

In one or more examples, to determine the microphone gain comprises to estimate, e.g. using a second loudness estimator, a second loudness also denoted L_2 of the media input signal; and determine, e.g. using a second averager, a second average also denoted A_2 based on the second loudness L_2.

In one or more examples, to determine the microphone gain comprises to determine, e.g, using a first gain determiner, a first gain also denoted G_1 based on the first primary average A_1_1 and/or the second average A_2. The first gain can be a gain vector. The first gain can be a gain vector with K frequency band gains. The first gain may also be denoted slow gain, and the purpose of the slow gain is to equalize the hearthrough and the media signal. The first gain is based on audio of a longer time period than the second gain.

In one or more examples, to determine the microphone gain comprises to determine, e.g. using a first secondary averager, a first secondary average also denoted A_1_2 based on the first loudness L_1; and determine, e.g. using a second gain determiner, a second gain also denoted G_2 based on the first secondary average A_1_2 and/or the second average A_2. The second gain can be a gain vector. The second gain can be a gain vector with K frequency band gains. The second gain may also be denoted fast gain, and the purpose of the fast gain is to preserve the natural dynamics within the hearthrough audio, while still reducing the dynamic range between the hearthrough and the media signal. The second gain works on audio of a shorter time period than the first gain, thus allowing for the second gain to catch transients. For example, in case of a car honking, the fast gain will reduce the transient, e.g. by halving the difference in dB between the hearthrough and the media, thus keeping the natural dynamics within the signal while also reducing the transient.

Therefore, combining the fast gain and the slow gain may in one or more examples, provide an audio device that is able to react to transients in the microphone signals and at the same time provides sufficient media signal.

In one or more examples, to determine the microphone gain comprises to determine the microphone gain based on the first gain and/or the second gain. The microphone gain G_MIC may be a function of the first gain G_1 and/or the second gain G_2.

The microphone gain G_MIC may be given as:

$$G\_MIC = G\_1 * G\_2$$

Advantageously, the disclosed audio devices can be used for all form factors in all types of environments, such as for headsets or earbuds. For example, the audio device may not have a specific microphone placement requirement. The audio device can utilize an adaptation ability to output high quality speech and intelligibility.

In one or more example audio devices, the audio device can advantageously improve an amount of hearthrough that is heard by a user, e.g. during playback of media. This can be performed via one or more processes discussed below. For example, the audio device can be configured to increase a relative amount of hearthrough in the audio output signal. The audio device can be configured to decrease, such as attenuate and/or suppress, a relative amount of hearthrough.

In one or more example audio devices, to determine a first primary average comprises to determine the first primary average over a first primary time period. The first primary average may be an exponential moving average. Other averages may be used for the first primary average.

In one or more examples, an average, such as the first primary average and/or the first secondary average, may be based on a one or more weights or coefficients, e.g. a primary weight applied to the parameter to be averaged and optionally a secondary weight applied to the current value of the average. In other words, an average, such as the first primary average and/or the first secondary average, may be a recursive average.

The first primary average may be given as:

$$A\_1\_1[n+1] = WP\_1\_1 * L\_1 + WS\_1\_1 * A\_1\_1[n],$$

where WP_1_1 is a primary weight applied to the current first loudness L_1 and WS_1_1 is a secondary weight applied to the current value of the first primary average.

In one or more examples, the primary weight WP_1_1 is in the range from 0 to 1, such as from 0.5 to 0.99, e.g. in the range from 0.7 to 0.95.

In one or more examples, the secondary weight WS_1_1 is in the range from 0.05 to 0.3.

In one or more example audio devices, to determine the first secondary average comprises to determine the first secondary average over a first secondary time period. The first secondary average may be an exponential moving average. Other averages may be used for the first secondary average.

The first secondary time period may be smaller than the first primary time period. In other words, the first secondary average may be faster than the first primary average.

In one or more examples, the first secondary average may be based on a one or more weights or coefficients, e.g. a primary weight applied to the parameter to be averaged and optionally a secondary weight applied to the current value of the first secondary average. In other words, the first secondary average may be a recursive average.

The first secondary average may be given as:

$$A\_1\_2[n+1] = WP\_1\_2 * L\_1 + WS\_1\_2 * A\_1\_2[n],$$

where WP_1_2 is a primary weight applied to the current first loudness L_1 and WS_1_2 is a secondary weight applied to the current value of the first secondary average.

In one or more examples, the primary weight WP_1_2 is in the range from 0 to 1, such as from 0.5 to 0.99, e.g. in the range from 0.7 to 0.95. In one or more examples, the primary weight WP_1_2 is larger than WP_1_1 to provide a first secondary average faster than the first primary average. In one or more examples, a difference between the primary weight WP_1_2 and the primary weight WP_1_1 is larger than 0.02, such as in the range from 0.04 to 0.20.

In one or more examples, the secondary weight WS_1_2 is in the range from 0.05 to 0.3. The secondary weight WS_1_2 may be smaller than WS_1_1 to provide a first secondary average faster than the first primary average.

In one or more example audio devices, to determine a second average comprises to determine the second average over a second time period. The second average may be an exponential moving average. Other averages may be used for the second average.

The second average may be given as:

$$A\_2[n+1] = WP\_2 * L\_2 + WS\_2 * A\_2[n],$$

where WP_2 is a primary weight applied to the current second loudness L_2 and WS_2 is a secondary weight applied to the current value of the second average.

In one or more examples, the primary weight WP_2 is in the range from 0.5 to 0.99, such as in the range from 0.7 to 0.95. In one or more examples, the secondary weight WP_2 is in the range from 0.01 to 0.5, such as in the range from 0.05 to 0.3.

In one or more example audio devices, to determine a first gain G_1[n+1], also denoted next gain, comprises to determine the first gain based on the first primary average, the second average, and a current first gain. In other words, the current first gain may be used for determining the next first gain. For example, the first gain may be based on, such as a function of, one or more of the first primary average, the second average, and a current first gain.

The first gain may be given as:

$$G\_1[n+1] = \begin{cases} G\_1[n]\cdot C \text{ if } L[n] + A_{1_1} < A\_2 - r \\ G\_1[n]\cdot C^{-1} \text{ if } L[n] + A\_1\_1 > A\_2 + r \\ G\_1[n] \text{ otherwise} \end{cases}$$

Where C is a gain change constant, L is G converted to dB, and r is a range constant.

In one or more example audio devices, to determine a second gain G_2[n+1], also denoted next gain, comprises to determine the second gain based on the first secondary average, the second average, and optionally a current or next first gain. In other words, the current or next first gain may be used for determining the next second gain. For example, the second gain may be based on, such as a function of, one or more of the first secondary average, the second average, and a current or next first gain.

The second gain may be given as:

$$G\_2[n+1] = 10^{-\frac{(A\_1\_2+L-A\_2)}{40}},$$

where L=G_1[n+1] converted to dB.

In one or more example audio devices, to determine the microphone gain comprises to determine a noise gain also denoted G_N, and to determine the microphone gain comprises to determine the microphone gain based on the noise gain. The microphone gain G_MIC may a function of the noise. The noise gain may work by attenuating small annoying background noise. However, when a large HT noise signal is detected, the noise gain may be set to allow such "noise signal" to pass. Thereby, it may be assured that if a car is honking at the user, the honking is not attenuated, thus, allowing the user some degree of situational awareness while attenuating general noise.

The microphone gain G_MIC may be given as:

$$G\_MIC = G\_1 \cdot G\_2 \cdot G\_N$$

In one or more example audio devices, to determine the noise gain comprises to determine a first noise average also denoted A_N_1, and determine the noise gain G_N based on the first noise average A_N_1. The first noise average may be a hearthrough noise floor or a true floor. The first noise average may be or comprise an exponential moving average. Other averages may be used for the first noise average.

In one or more example audio devices, to determine the noise gain comprises to determine a second noise average also denoted A_N_2, and determine the noise gain G_N based on the second noise average A_N_2. The second noise average may be a noise floor. The second noise average may be or comprise an exponential moving average. Other averages may be used for the second noise average.

In one or more examples, the noise gain is given as:

$$G\_N[n+1] = \begin{cases} G_{Nmin} \text{if } (A\_N\_1 < A\_N\_2 \cdot T\_N) \\ 1 \text{ if } (A\_N\_1 > A\_N\_2 \cdot T\_N) \end{cases},$$

where T_N is a threshold, such as a tunable threshold coefficient.

In one or more example audio devices, the audio device comprises a first voice activity detector, e.g. configured to detect user voice. To process the microphone input signal may comprise to determine, using the first voice activity detector, whether the microphone input signal comprises a user voice, such as for provision of first voice detector output indicative of presence of user voice. To determine the first primary average and/or to determine the first secondary average may be paused when user voice is present. In other words, the first primary average and/or the first secondary average are optionally not updated when the user speaks.

In one or more example audio devices, to determine the first noise average and/or to determine the second noise average is paused when user voice is present.

In one or more example audio devices, to determine the microphone gain comprises to determine a voice activity gain, and to determine the microphone gain comprises to determine the microphone gain based on voice activity gain. Voice activity gain may be a a gate function. For example, when the gate is closed (no voice activity), hearthrough can be attenuated, however if speech is detected (voice activity present) the gate is opened and hearthrough is not attenuated. This may be considered as a viable alternative to ANC mode in an office environment, where general noise may be desired to be reduced, while speech from colleagues talking to the user is not to be reduced.

In one or more example audio devices, the audio device comprises a second voice activity detector, e.g. configured to detect far field voice. To process the microphone input signal may comprise to determine, using the second voice activity detector, whether the microphone input signal comprises a far field voice, such as for provision of second voice detector output indicative of presence of far field voice. To determine the voice activity gain may be based on the second voice detector output.

In one or more example audio devices, to estimate a first loudness of the microphone input signal comprises to estimate, e.g. using a first power estimator, a first power also denoted P_1 of the microphone input signal, and determine, e.g. using a first LKFS estimator, the first loudness L_1 based on the first power P_1.

In one or more example audio devices, to estimate a second loudness of the media input signal comprises to estimate, e.g. using a second power estimator, a second power also denoted P_2 of the media input signal, and determine, e.g. using a second LKFS estimator, the second loudness L_2 based on the second power P_2.

In one or more example audio devices, to determine the second gain G_2 comprises to determine the second gain G_2 based on the first gain G_1.

In one or more example audio devices, to provide the audio output signal comprises to mix, such as add or linearly combine, the microphone output signal and the media input signal.

In one or more example audio devices, the audio device, such as the one or more processors, may include a controller. One or more of the operations and/or functionalities discussed with respect to the example disclosed audio devices can be optimized, controlled, changed, and/or modified, for example through the use of one or more controllers. The controller can be configured to send one or more control signals. It is to be understood that a description of a feature in relation to the one or more processors configured to perform acts, e.g. to estimate and/or to determine, these acts are also applicable to the corresponding feature in the method(s) of operating an audio device as disclosed herein, e.g. estimating and/or determining, and vice versa.

FIG. 1 shows an exemplary audio system 1 comprising an example audio device 2 and one or more audio or media sources. The audio system 1 comprises one or more audio or media sources including primary media source 4 being a smart phone 4A in FIG. 1. The audio device 2 may be a hearing device, such as a hearing aid, or a hearable, such as a headset or earphones. The audio device 2 may be an earpiece as illustrated in FIG. 1. The audio device and/or functionality thereof may be distributed over multiple entities, such as an earpiece and an audio source. The audio device may be configured to be worn at the ear of a user. The primary media source 4 may be an electronic device, e.g., a smartphone, a TV or TV audio transmitter or audio speaker as illustrated, configured to connect, such as by wire or using Bluetooth or BLE, with the audio device 2. The primary media source 4 may be one of a smartphone, a tablet computer, a laptop computer, a personal computer, a microphone device, a wireless TV audio transmitter, a music player, car stereo, a smart watch, and a wireless audio transmitter, such as a public wireless audio transmitter, e.g., in airports, train stations, stadiums, cinemas, arenas, and/or emergency vehicles, such as ambulances, police cars, firetrucks, etc.

The audio device 2 comprises an interface 6, a memory 8, and one or more processors 10 for provision of an audio output signal 10A. The interface 6 of audio device 2 comprises an input module 12 comprising one or more microphones for provision of a microphone input signal 12A to the one or more processors 10, the one or more microphones including a first microphone 14 for provision of a first microphone input signal, and optionally a second microphone 16 for provision of a second microphone input signal. The microphone input signal 12A is based on one or both of the first microphone input signal and the second microphone input signal. The input module may comprise a filterbank (not shown) for provision of the microphone input signal 12A as a K-channel microphone input signal. In one or more examples, the one or more processors are configured for K-channel processing.

The interface 6 of audio device 2 comprises a first wireless communication unit 18 comprising a transceiver 19 and an antenna 20 configured for wireless communication, e.g., with one or more audio sources, such as the primary audio source 4.

The transceiver 19 is configured to convert wireless input signal(s) including a first wireless input signal 22 received from primary media source 4 to one or more transceiver input signals including a media input signal 24. The media input signal 24 is input to the one or more processors 10.

The interface 6 of audio device 2 optionally comprises an input button 26 for receiving user input.

The interface of audio device 2 comprises a loudspeaker 28 for converting the audio output signal 10A to an audio output.

Figure 2:
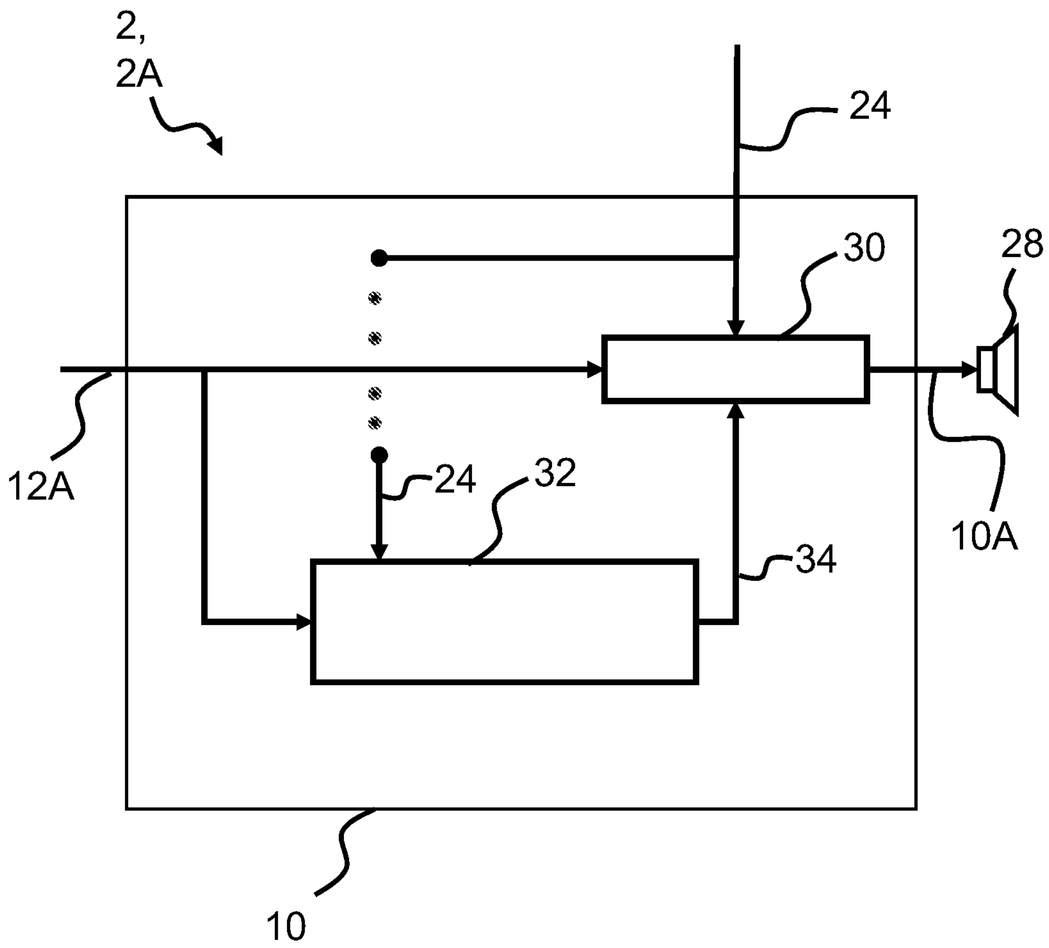
FIG. 2 illustrates an example audio device according to the disclosure.

FIG. 2 is a block diagram illustrating processing in an example audio device, such as audio device 2. The one or more processors 10 receives the microphone input signal 12A and a media input signal 24. The one or more processors 10 comprises a mixer 30 and a controller 32. The microphone input signal 12A and the media input signal 24 are fed to the mixer 30 configured to process the microphone input signal 12A for provision of a microphone output signal by applying a microphone gain G_MIC to the microphone input signal 12A. The mixer 30 is configured to provide the output signal 10A based on the microphone input signal 12A and the media input signal 24, e.g. as a linear combination, such as a per-band linear combination, of the microphone input signal 12A and the media input signal 24. For example, the audio output signal 10A also denoted AOS may be given as:

$$AOS = G\_MIC * IS\_MIC + G\_MED * IS\_MED,$$

where G_MIC is a microphone gain applied to the microphone input signal IS_MIC for provision of a microphone output signal, and G_MED is a media gain applied to the media input signal IS_MED for provision of a media output signal. It is noted that AO, G_MIC, IS_MIC, G_MED, IS_MED may be vectors with K values for processing input signals in K bands or channels in the audio device.

Further, the microphone input signal 12A and the media input signal 24 are fed to the controller 32. The controller 32 is configured to process the microphone input signal 12A and the media input signal 24 for determining the microphone gain G_MIC as described in further detail with reference to FIG. 3. The controller outputs a control signal 34 indicative of the microphone gain G_MIC to the mixer 30 which in turn applies the microphone gain to the microphone input signal.

Figure 3:
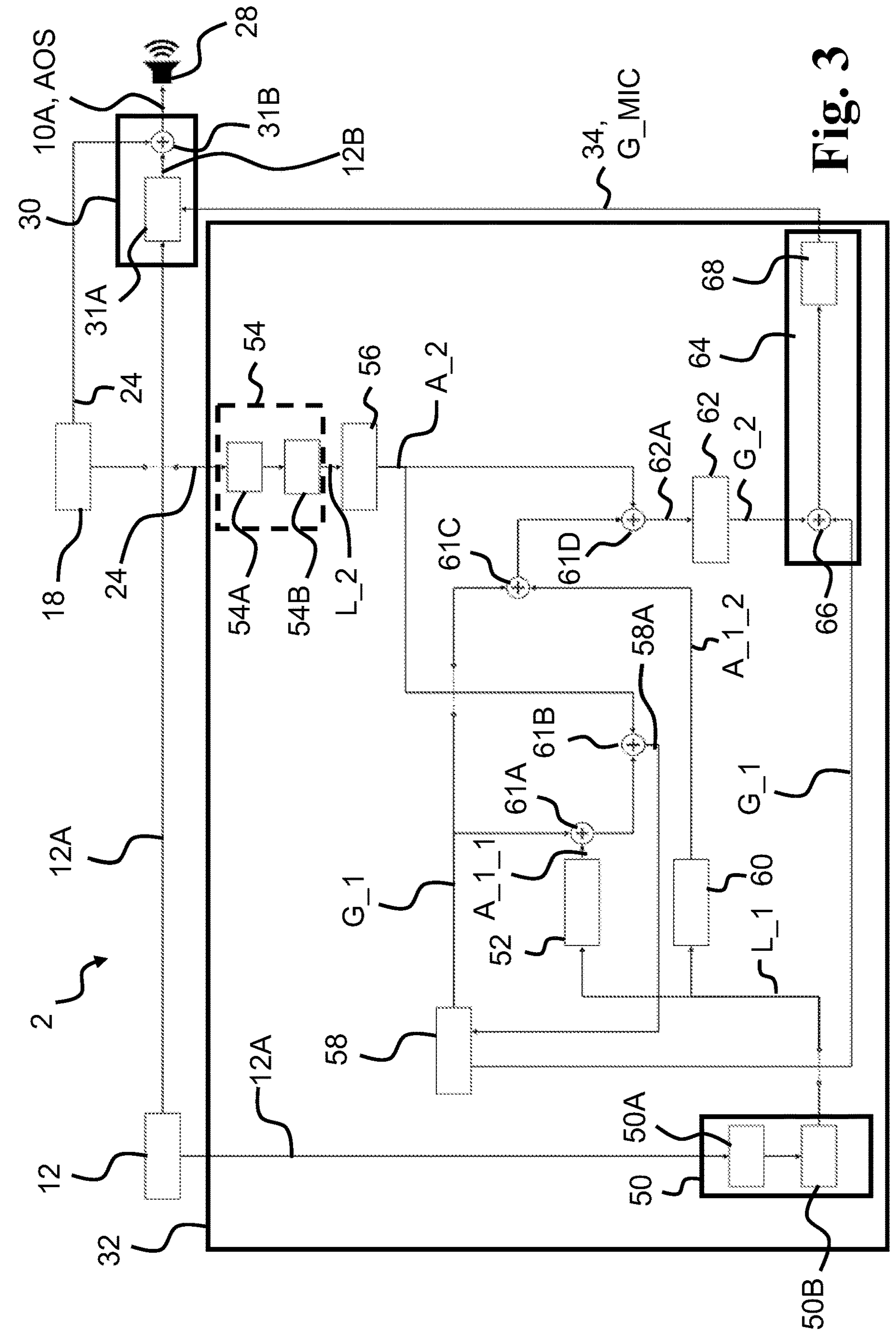
FIG. 3 illustrates an example controller according to the disclosure.

FIG. 3 schematically illustrates example implementations of the present disclosure. The one or more processors 10, such as the controller 32, of audio device 2 comprises a first loudness estimator 50 configured to estimate a first loudness L_1 of the microphone input signal 12A, and a first primary averager 52 configured to determine a first primary average A_1_1 based on the first loudness L_1. The first loudness estimator 50 may comprise a first power estimator 50A and/or a first LKFS estimator 50B.

The one or more processors 10, such as the controller 32, optionally comprises a second loudness estimator 54 configured to estimate a second loudness L_2 of the media input signal 24, and a second averager 56 configured to determine a second average A_2 based on the second loudness L_2. The second loudness estimator 54 may comprise a second power estimator 54A and/or a second LKFS estimator 54B.

The one or more processors 10, such as the controller 32, comprises a first gain determiner 58 configured to determine a first gain G_1 based on the first primary average A_1_1 and the second average A_2. In other words, a first gain control signal 58A for controlling the first gain G_1 may be based on, such as a sum of the first primary average A_1_1 and the second average A_2.

The one or more processors 10, such as the controller 32, may comprise a first secondary averager 60 configured to determine a first secondary average A_1_2 based on the first loudness L_1.

The one or more processors 10, such as the controller 32, comprises a second gain determiner 62 configured to determine a second gain G_2 based on the first secondary average A_1_2 and the second average A_2. The second gain G_2 is optionally based on the first gain G_1.

The (current) first gain G_1 and the first primary average A_1_1 are added in first adder 61A, the sum of G_1 and A_1_1 being fed to second adder 61B where the second average A_2 is added for provision of the first gain control signal 58A.

The (current) first gain G_1 and the first secondary average A_1_2 are added in third adder 61C, the sum of G_1 and A_1_2 being fed to fourth adder 61D where the second average A_2 is added for provision of the second gain control signal 62A.

The one or more processors 10, such as the controller 32, comprises a microphone gain determiner 64 configured to determine the microphone gain G_MIC based on, such as a function of, the first gain G_1 and/or the second gain G_2. The microphone gain determiner 64 optionally comprises gain adder 66 for adding or multiplying the first gain and the second gain optionally followed by a gain limiter 68 for provision of the microphone gain.

The microphone gain G_MIC or a control signal 34 indicative of the microphone gain is fed to the mixer 30 comprising a microphone gain module 31A and output adder, the microphone gain module 31A configured to apply the microphone gain G_MIC to the microphone input signal 12A for provision of microphone output signal 12B that is added to the media input signal in output adder for provision of the audio output signal 10A.

Figure 4:
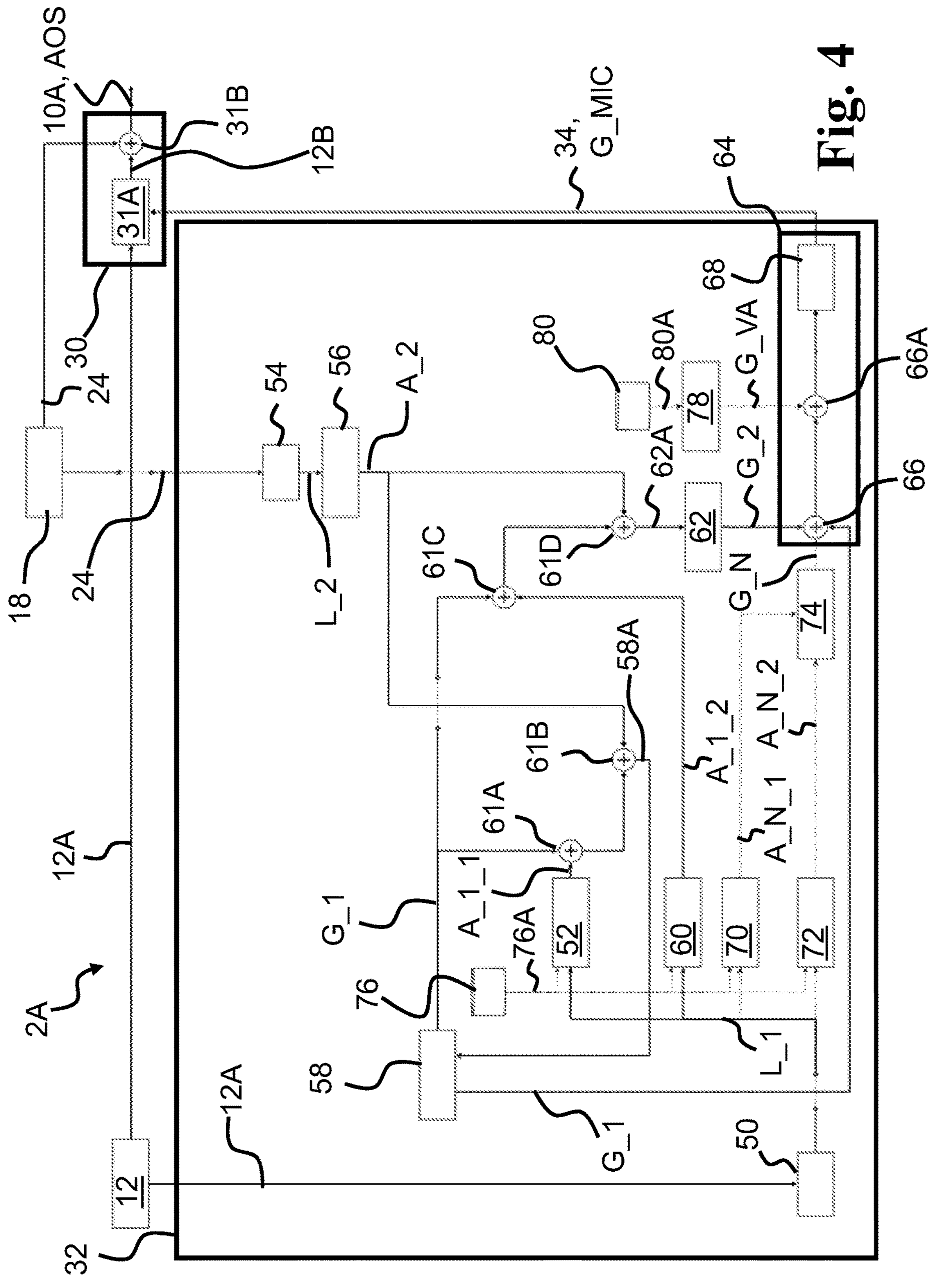
FIG. 4 illustrates an example controller according to the disclosure.

FIG. 4 schematically illustrates example implementations of the present disclosure. The one or more processors 10, such as the controller 32, of audio device 2A comprises a first loudness estimator 50 configured to estimate a first loudness L_1 of the microphone input signal 12A, and a first primary averager 52 configured to determine a first primary average A_1_1 based on the first loudness L_1. The first loudness estimator 50 may comprise a first power estimator 50A and/or a first LKFS estimator 50B.

The one or more processors 10, such as the controller 32, optionally comprises a second loudness estimator 54 configured to estimate a second loudness L_2 of the media input signal 24, and a second averager 56 configured to determine a second average A_2 based on the second loudness L_2. The second loudness estimator 54 may comprise a second power estimator 54A and/or a second LKFS estimator 54B.

The one or more processors 10, such as the controller 32, comprises a first gain determiner 58 configured to determine a first gain G_1 based on the first primary average A_1_1 and the second average A_2. In other words, a first gain control signal 58A for controlling the first gain G_1 may be based on, such as a sum of the first primary average A_1_1 and the second average A_2.

The one or more processors 10, such as the controller 32, may comprise a first secondary averager 60 configured to determine a first secondary average A_1_2 based on the first loudness L_1.

The one or more processors 10, such as the controller 32, comprises a second gain determiner 62 configured to determine a second gain G_2 based on the first secondary average A_1_2 and the second average A_2. The second gain G_2 is optionally based on the first gain G_1.

The one or more processors 10, such as the controller 32, optionally comprises a first noise averager 70 configured to determine a first noise average A_N_1. The first noise average may be a hearthrough noise floor and an exponential moving average.

The one or more processors 10, such as the controller 32, optionally comprises a second noise averager 72 configured to determine a second noise average A_N_2. The second noise average is different from the first noise average and may be a noise floor and an exponential moving average.

The one or more processors 10, such as the controller 32, optionally comprises a noise gain determiner 74 configured to determine a noise gain G_N based on the first noise average A_N_1 and/or the second noise average A_N_2. The noise gain G_N is optionally added to the first gain G_1 and the second gain G_2 in gain adder 66. Thus, the microphone gain is based on the noise gain G_N.

The one or more processors 10, such as the controller 32, optionally comprises a first voice activity detector 76, e.g. configured to detect user voice. To process the microphone input signal may comprise to determine, using the first voice activity detector, whether the microphone input signal comprises a user voice, such as for provision of first voice detector output 76A indicative of presence of user voice. The first voice detector output 76A optionally controls one or more of averagers 52, 60, 70, 72. For example, the first primary averager 52 may pause determining the first primary average when the first voice detector output 76A indicates that user voice is present, e.g. in the microphone input signal 12A and/or the first secondary averager 60 may pause determining the first secondary average when the first voice detector output 76A indicates that user voice is present, e.g. in the microphone input signal 12A.

For example, the first noise averager 70 may pause determining the first noise average when the first voice detector output 76A indicates that user voice is present, e.g. in the microphone input signal 12A and/or the second noise averager 72 may pause determining the second noise average when the first voice detector output 76A indicates that user voice is present, e.g. in the microphone input signal 12A.

The one or more processors 10, such as the controller 32, optionally comprises a voice gain determiner 78 configured to determine a voice activity gain G_VA. The voice activity gain G_VA is added to or multiplied with the first gain, second gain and optionally the noise using secondary gain adder 66A, and the resulting gain is fed to gain limiter 68 for provision of the microphone gain.

The one or more processors 10, such as the controller 32, optionally comprises a second voice activity detector 80, e.g. configured to detect far field voice, such as for provision of second voice detector output 80A indicative of presence of far field voice. The second voice detector output 80A optionally controls the voice gain determiner 78 and thus to determine the voice activity gain G_VA may be based on the second voice detector output 80A. Thus, the second voice detector may be set to "1" or "true" if voice is present, and the voice gain determiner may increase the voice activity gain. If "0" or "false", voice activity gain is turned down or reduced. Thus, a scenario or user situation may be provided, where the user hears hearthrough only if speech is detected.

In one or more example audio devices, at least two, such as three of the first gain, the second gain, the noise gain, and the voice activity gain are added or multiplied and optionally gain limited for provision of the microphone gain. For example, the microphone gain determiner 64 can be configured to determine the microphone gain G_MIC based on the first gain G_1, the second gain G_2 and one or both of the noise gain G_N and the voice activity gain G_VA.

One or more example audio devices are outlined in the following items.

Item 1. Audio device comprising an interface, a memory, and one or more processors, wherein the one or more processors are configured to:
- obtain a microphone input signal;
- obtain a media input signal;
- process the microphone input signal for provision of a microphone output signal; and
- provide an audio output signal based on the microphone output signal, wherein to process the microphone input signal comprises to:
- determine a microphone gain; and
- apply the microphone gain to the microphone input signal for provision of the microphone output signal, and wherein to determine the microphone gain comprises:
- estimate a first loudness of the microphone input signal;
- determine a first primary average based on the first loudness;
- estimate a second loudness of the media input signal;
- determine a second average based on the second loudness;
- determine a first gain based on the first primary average and the second average;
- determine a first secondary average based on the first loudness;
- determine a second gain based on the first secondary average and the second average; and
- determine the microphone gain based on the first gain and the second gain.

Item 2. Audio device according to Item 1, wherein to determine a first primary average comprises to determine the first primary average over a first primary time period, and wherein to determine the first secondary average comprises to determine the first secondary average over a first secondary time period smaller than the first primary time period.

Item 3. Audio device according to any one of Items 1-2, wherein to determine a second average comprises to determine the second average over a second time period.

Item 4. Audio device according to any one of Items 1-3, wherein to determine a first gain comprises to determine the first gain based on the first primary average, the second average, and a current first gain.

Item 5. Audio device according to any one of Items 1-4, wherein to determine the microphone gain comprises to determine a noise gain, and to determine the microphone gain comprises to determine the microphone gain based on the noise gain.

Item 6. Audio device according to Item 5, wherein to determine the noise gain comprises to determine a first noise average, and determine the noise gain based on the first noise average.

Item 7. Audio device according to any one of Items 5-6, wherein to determine the noise gain comprises to determine a second noise average, and determine the noise gain based on the second noise average.

Item 8. Audio device according to any one of Items 1-7, the audio device comprising a first voice activity detector, wherein to process the microphone input signal comprises to determine, using the first voice activity detector, whether the microphone input signal comprises a user voice for provision of first voice detector output indicative of presence of user voice, and wherein to determine the first primary average and/or to determine the first secondary average is paused when user voice is present.

Item 9. Audio device according to Item 8 as dependent on any one of Items 6-7, wherein to determine the first noise average and/or to determine the second noise average is paused when user voice is present.

Item 10. Audio device according to any one of Items 1-9, wherein to determine the microphone gain comprises to determine a voice activity gain, and to determine the microphone gain comprises to determine the microphone gain based on voice activity gain.

Item 11. Audio device according to Item 10, the audio device comprising a second voice activity detector, wherein to process the microphone input signal comprises to determine, using the second voice activity detector, whether the microphone input signal comprises a far field voice for provision of second voice detector output indicative of presence of far field voice, and wherein to determine the voice activity gain is based on the second voice detector output.

Item 12. Audio device according to any one of Items 1-11, wherein to estimate a first loudness of the microphone input signal comprises to estimate a first power of the microphone input signal, and determine the first loudness based on the first power.

Item 13. Audio device according to any one of Items 1-12, wherein to estimate a second loudness of the media input signal comprises to estimate a second power of the media input signal, and determine the second loudness based on the second power.

Item 14. Audio device according to any one of Items 1-13, wherein to determine the second gain comprises to determine the second gain based on the first gain.

Item 15. Audio device according to any one of Items 1-14, wherein to provide the audio output signal comprises to mix the microphone output signal and the media input signal.

It may be appreciated that the figures comprise some modules or operations which are illustrated with a solid line and some modules or operations which are illustrated with a dashed line. The modules or operations which are comprised in a solid line are modules or operations which are comprised in the broadest example embodiment. The modules or operations which are comprised in a dashed line are example embodiments which may be comprised in, or a part of, or are further modules or operations which may be taken in addition to the modules or operations of the solid line example embodiments. It should be appreciated that these operations need not be performed in the order presented. Furthermore, it should be appreciated that not all of the operations need to be performed. The exemplary operations may be performed in any order and in any combination.

It is to be noted that the word "comprising" does not necessarily exclude the presence of other elements or steps than those listed.

It is to be noted that the words "a" or "an" preceding an element do not exclude the presence of a plurality of such elements.

It should further be noted that any reference signs do not limit the scope of the claims, that the exemplary embodiments may be implemented at least in part by means of both hardware and software, and that several "means" "units" or "devices" may be represented by the same item of hardware.

The various exemplary methods, modules, devices, and systems described herein are described in the general context of method steps processes, which may be implemented in one aspect by a computer program product, embodied in a computer-readable medium, including computer-executable instructions, such as program code, executed by computers in networked environments. A computer-readable medium may include removable and non-removable storage devices including, but not limited to, Read Only Memory (ROM), Random Access Memory (RAM), compact discs (CDs), digital versatile discs (DVD), etc. Generally, program modules may include routines, programs, objects, components, data structures, etc. that perform specified tasks or implement specific abstract data types. Computer-executable instructions, associated data structures, and program modules represent examples of program code for executing steps of the methods disclosed herein. The particular sequence of such executable instructions or associated data structures represents examples of corresponding acts for implementing the functions described in such steps or processes.

Although features have been shown and described, it will be understood that they are not intended to limit the claimed invention, and it will be made obvious to those skilled in the art that various changes and modifications may be made without departing from the spirit and scope of the claimed invention. The specification and drawings are, accordingly to be regarded in an illustrative rather than restrictive sense. The claimed invention is intended to cover all alternatives, modifications, and equivalents.

LIST OF REFERENCES

2, 2A audio device
4 primary media source
4A smart phone
6 interface
8 memory
10 one or more processors
10A audio output signal
12 input module
12A microphone input signal
12B microphone output signal
14 first microphone
16 second microphone
18 first wireless communication unit
19 transceiver
20 antenna
22 first wireless input signal
24 media input signal
26 input button
28 loudspeaker
30 mixer
31A microphone gain module
31B output adder
32 controller
34 control signal indicative of the microphone gain
50 first loudness estimator
50A first power estimator
50B first LKFS (Loudness, K-weighted, relative to full scale) estimator
52 first primary averager
54 second loudness estimator
56 second average
58 first gain determiner
58A first gain control signal
60 first secondary average
61A first adder
61B second adder
61C third adder
61D fourth adder
62 second gain determiner
62A second gain control signal
64 microphone gain determiner
66 gain adder
66A secondary gain adder
68 gain limiter
70 first noise averager
72 second noise averager
74 noise gain determiner
76 first voice detector
76A first voice detector output
78 voice gain determiner
80 second voice detector
80A second voice detector output

The invention claimed is:

1. An audio device comprising an interface, a memory, and one or more processors, wherein the one or more processors are configured to:
- obtain a microphone input signal;
- obtain a media input signal;
- process the microphone input signal for provision of a microphone output signal; and
- provide an audio output signal based on the microphone output signal, wherein to process the microphone input signal comprises to:
- determine a microphone gain; and
- apply the microphone gain to the microphone input signal for provision of the microphone output signal, and wherein to determine the microphone gain comprises:
- estimate a first loudness of the microphone input signal;
- determine a first primary average based on the first loudness;
- estimate a second loudness of the media input signal;
- determine a second average based on the second loudness;
- determine a first gain based on the first primary average and the second average;
- determine a first secondary average based on the first loudness;
- determine a second gain based on the first secondary average and the second average; and
- determine the microphone gain based on the first gain and the second gain.

2. The audio device according to claim 1, wherein to determine a first primary average comprises to determine the first primary average over a first primary time period, and wherein to determine the first secondary average comprises to determine the first secondary average over a first secondary time period smaller than the first primary time period.

3. The audio device according to claim 1, wherein to determine a second average comprises to determine the second average over a second time period.

4. The audio according to claim 1, wherein to determine a first gain comprises to determine the first gain based on the first primary average, the second average, and a current first gain.

5. The audio according to claim 1, wherein to determine the microphone gain comprises to determine a noise gain, and to determine the microphone gain comprises to determine the microphone gain based on the noise gain.

6. The audio according to claim 5, wherein to determine the noise gain comprises to determine a first noise average, and determine the noise gain based on the first noise average.

7. The audio according to claim 5, wherein to determine the noise gain comprises to determine a second noise average, and determine the noise gain based on the second noise average.

8. The audio device according to claim 1, the audio device comprising a first voice activity detector, wherein to process the microphone input signal comprises to determine, using the first voice activity detector, whether the microphone input signal comprises a user voice for provision of first voice detector output indicative of presence of user voice, and wherein to determine the first primary average and/or to determine the first secondary average is paused when user voice is present.

9. The audio device according to claim 5, wherein to determine the noise gain comprises to determine a first noise average, and determine the noise gain based on the first noise average, the audio device comprising a first voice activity detector, wherein to process the microphone input signal comprises to determine, using the first voice activity detector, whether the microphone input signal comprises a user voice for provision of first voice detector output indicative of presence of user voice, and wherein to determine the first primary average and/or to determine the first secondary average is paused when user voice is present, and wherein to determine the first noise average and/or to determine the second noise average is paused when user voice is present.

10. The audio device according to claim 1, wherein to determine the microphone gain comprises to determine a voice activity gain, and to determine the microphone gain comprises to determine the microphone gain based on voice activity gain.

11. The audio device according to claim 10, the audio device comprising a second voice activity detector, wherein to process the microphone input signal comprises to determine, using the second voice activity detector, whether the microphone input signal comprises a far field voice for provision of second voice detector output indicative of presence of far field voice, and wherein to determine the voice activity gain is based on the second voice detector output.

12. The audio device according to claim 1, wherein to estimate a first loudness of the microphone input signal comprises to estimate a first power of the microphone input signal, and determine the first loudness based on the first power.

13. The audio device according to claim 1, wherein to estimate a second loudness of the media input signal comprises to estimate a second power of the media input signal, and determine the second loudness based on the second power.

14. The audio device according to claim 1, wherein to determine the second gain comprises to determine the second gain based on the first gain.

15. The audio device according to claim 1, wherein to provide the audio output signal comprises to mix the microphone output signal and the media input signal.

* * * * *